(12) United States Patent
Zhang et al.

(10) Patent No.: US 11,375,628 B2
(45) Date of Patent: Jun. 28, 2022

(54) FOLDABLE DISPLAY DEVICE (71) Applicant: WUHAN CHINA STAR OPTOELECTRONICS SEMICONDUCTOR DISPLAY TECHNOLOGY CO., LTD., Wuhan (CN)

(72) Inventors: Zhuo Zhang, Wuhan (CN); Fang Wang, Wuhan (CN); Wen Han, Wuhan (CN); Zikang Feng, Wuhan (CN)

(*) Notice: Subject to any disclaimer, the term of this patent is extended or adjusted under 35 U.S.C. 154(b) by 135 days.

(21) Appl. No.: 16/767,130

(22) PCT Filed: Nov. 19, 2019

(86) PCT No.: PCT/CN2019/119505
§ 371 (c)(1),
(2) Date: May 27, 2020

(87) PCT Pub. No.: WO2021/077512
PCT Pub. Date: Apr. 29, 2021

(65) Prior Publication Data
US 2022/0039273 A1 Feb. 3, 2022

(30) Foreign Application Priority Data
Oct. 23, 2019 (CN) .......................... 201911013745.0

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC .... G06F 1/1652; G06F 1/1616; G06F 1/1681; G06F 1/1618; G09F 9/301
See application file for complete search history.

(56) References Cited

U.S. PATENT DOCUMENTS

| | | | | |
|---|---|---|---|---|
| 10,403,236 B2 * | 9/2019 | Ent | ........................ | G06F 3/0481 |
| 10,881,009 B2 * | 12/2020 | Jiang | .................... | H05K 5/0017 |
| 10,938,970 B1 * | 3/2021 | Lee | ........................ | H04M 1/0237 |
| 11,140,252 B1 * | 10/2021 | Choi | ...................... | G06F 1/1624 |
| 2011/0126141 A1 * | 5/2011 | King | .................... | G06F 3/04817 |
| | | | | 715/769 |
| 2012/0002360 A1 * | 1/2012 | Seo | ........................ | G06F 1/1652 |
| | | | | 361/679.01 |
| 2012/0314400 A1 * | 12/2012 | Bohn | ........................ | G09F 9/35 |
| | | | | 361/679.01 |
| 2013/0010405 A1 * | 1/2013 | Rothkopf | ............. | H05K 5/0226 |
| | | | | 361/679.01 |
| 2013/0058063 A1 * | 3/2013 | O'Brien | ................ | G06F 1/1652 |
| | | | | 361/807 |

(Continued)

*Primary Examiner* — Hung S. Bui
*Assistant Examiner* — Sagar Shrestha (57) ABSTRACT

A foldable display device includes a first casing having a first receiving cavity inside, a rewinding component disposed in the first receiving cavity, a second casing disposed on a side of the first casing, a stretching component slidably having an end slidingly connected to the first casing and another end rotationally connected to the second casing, and a flexible display component having a part disposed on a same side of the first casing and the second casing and another part protruding into the first receiving cavity and connected to the rewinding component.

17 Claims, 6 Drawing Sheets

(56) References Cited

U.S. PATENT DOCUMENTS

| | | | |
|---|---|---|---|
| 2013/0169545 A1* | 7/2013 | Eaton | G06F 1/1647 |
| | | | 345/173 |
| 2015/0116921 A1* | 4/2015 | Hsu | G06F 1/1624 |
| | | | 361/679.27 |
| 2015/0373863 A1* | 12/2015 | Lin | A45C 11/00 |
| | | | 206/774 |
| 2016/0366772 A1* | 12/2016 | Choi | G06F 1/1652 |
| 2018/0014417 A1* | 1/2018 | Seo | H05K 5/0217 |
| 2018/0098440 A1* | 4/2018 | Choi | G06F 1/1624 |
| 2018/0102072 A1* | 4/2018 | Lee | G09F 9/301 |
| 2018/0103552 A1* | 4/2018 | Seo | G09F 9/301 |
| 2018/0129246 A1* | 5/2018 | Ko | G06F 1/1616 |
| 2019/0243424 A1* | 8/2019 | Lee | G06F 1/1679 |
| 2019/0320048 A1* | 10/2019 | Yang | H04M 1/0268 |
| 2021/0076517 A1* | 3/2021 | Wang | H04M 1/0268 |
| 2021/0373603 A1* | 12/2021 | Feng | G06F 1/1624 |

\* cited by examiner

FOLDABLE DISPLAY DEVICE

FIELD OF INVENTION

The present disclosure relates to the field of display panel technologies, and more particularly to a foldable display device.

BACKGROUND OF INVENTION

The statements herein merely provide background information related to the present application and do not necessarily constitute prior art.

At present, organic light emitting diodes (OLEDs) have attracted widespread attention for their foldability and flexibility. By folding or rolling up the OLED, space occupied by a larger screen can be reduced, making it more portable. Therefore, folding and rolling up display devices have become a main research direction of flexible OLED screens.

Current flexible OLED screens include both foldable and rollable displays. Although the above two display screens reduce sizes of display devices to a certain extent, they still occupy a large space. This is not conducive to storage and carrying of the flexible OLED screen of a larger size. In addition, current foldable display devices need to adopt a compensation design for a connection component of a folding area for a casing folding to avoid a flexible display screen from being damaged due to contraction or expansion of the connection component during a bending process. However, a structural design of the current connection components is relatively complicated and takes up a large space, which is not conducive to saving production costs and improving production efficiency. Therefore, how to realize a flexible display device with a larger display area and more convenient carrying is an important research direction.

SUMMARY OF INVENTION

The present application provides a foldable display device. By combining a foldable flexible display screen and a stretchable flexible display screen, a foldable display device with a larger display area and more convenient carrying is realized.

To solve the above problems, technical solutions provided in this application are as follows.

An embodiment of the present application provides a foldable display device comprising: a first casing having a first receiving cavity inside, a rewinding component disposed in the first receiving cavity, a stretching component slidably connected to the first casing, a first rotating component connected to an end of the stretching component away from the first casing, a second casing connected to the first rotating component, and a flexible display component having a part disposed on a same side of the first casing and the second casing and another part protruding into the first receiving cavity and connected to the rewinding component; wherein the second casing is rotatably connected to the stretching component through the first rotating component; and when the flexible display component disposed in the first receiving cavity is stretched out, the rewinding component provides a flexible elastic pulling force to the flexible display component.

In an embodiment of the present application, the flexible display component comprises a first display part, a second display part, and a third display part sequentially disposed adjacent to each other; the first display part is disposed on a side of the second casing, an end of the first display part away from the second display part is connected to the second casing, and an end of the third display part away from the second display part is connected to the rewinding component.

In an embodiment of the present application, when the foldable display device is in a first state, the stretching component and the first casing are deployed to each other, and the second casing and the stretching component are deployed to each other; the flexible display component is laid on a same side of the second casing, the stretching component, and the first casing, the first display part corresponds to the second casing, the second display part corresponds to the stretching component, and the third display part corresponds to the first casing.

In an embodiment of the present application, when the foldable display device is in a second state, the stretching component and the first casing are overlapped with each other, and the second casing and the stretching component are folded to each other; the first display part and the second display part are laid on a same side of the second casing and the first casing, the first display part corresponds to the second casing, the second display part corresponds to the first casing, and the third display part is rolled up in the first receiving cavity by the rewinding component.

In an embodiment of the present application, the second casing comprises a first sub casing, a second sub casing, and a second rotating component disposed between the first sub casing and the second sub casing; the first sub casing is rotatably connected to the second sub casing through the second rotating component; the first sub casing is further connected to the first rotating component, and the first sub casing is further rotatably connected to the stretching component through the first rotating component.

In an embodiment of the present application, the first display part comprises a first sub-display part and a second sub-display part arranged adjacently, the first sub-display part is disposed between the second display part and the second sub-display part, the first sub-display part is disposed corresponding to the first sub casing, and the second sub-display part is disposed corresponding to the second sub casing.

In an embodiment of the present application, when the foldable display device is in a first state, the stretching component and the first casing are deployed to each other, and the first sub casing, the second sub casing, and the stretching component are all deployed; the flexible display component is laid on a same side of the first sub casing, the second sub casing, the stretching component, and the first casing, the first sub display part corresponds to the first sub casing, the second sub-display part corresponds to the second sub casing, the second display part corresponds to the stretching component, and the third display part corresponds to the first casing.

In an embodiment of the present application, when the foldable display device is in a second state, the stretching component and the first casing are overlapped with each other, the first sub casing and the stretching component are folded to each other, and the second sub casing and the first sub casing are folded to each other; the first sub-display part, the second sub-display part, and the second display part are laid on a same side of the second sub casing, the first sub casing, and the first casing, the first sub-display part corresponds to the first sub casing, the second sub-display part corresponds to the second sub casing, the second display part corresponds to the first casing, and the third display part is rolled up in the first receiving cavity by the rewinding component.

In an embodiment of the present application, when the foldable display device is in the second state, the stretching component, the first sub casing and the second sub casing are arranged in a zigzag shape.

In an embodiment of the present application, when the foldable display device is in a third state, the stretching component and the first casing are overlapped with each other, the second casing and the stretching component are rotated to be set at a preset included angle, and the first sub casing and the second sub casing are deployed to each other; the flexible display component is laid on a same side of the first casing, the first sub casing, and the second sub casing, the first sub-display part corresponds to the first sub casing, the second sub-display part corresponds to the second sub casing, the second display part corresponds to the first casing, and the third display part is rolled up in the first receiving cavity by the rewinding component.

In an embodiment of the present application, the preset included angle ranges from 60 degrees to 120 degrees.

In an embodiment of the present application, a side of the first casing away from the second casing is provided with a first opening communicating with the first receiving cavity; an end of the third display part away from the second display part is connected to the rewinding component through the first opening.

In an embodiment of the present application, a side of the first casing away from the first opening is provided with a second opening, and the second opening is in communication with the first receiving cavity, the stretching component is received in the first receiving cavity through the second opening so as to be overlapped with the first casing.

In an embodiment of the present application, a side of the stretching component away from the second casing is provided with a third opening, the stretching component is further provided with a second receiving cavity which is in communication with the third opening, and the first casing is received in the second receiving cavity through the third opening so as to be overlapped with the stretching component.

In an embodiment of the present application, the rewinding component comprises a coil spring, the coil spring is disposed in the first receiving cavity and is connected to the first casing, and an end of the flexible display component protruding into the first receiving cavity is connected to the coil spring.

In an embodiment of the present application, the rewinding component further comprises a roller disposed in the first receiving cavity and having an axis parallel to the coil spring; the roller is disposed on a side of the coil spring away from the second casing, and an end of the flexible display component away from the second casing is connected to the coil spring in the first receiving cavity around the roller.

In an embodiment of the present application, the first rotating component comprises a first rotating shaft and a second rotating shaft arranged side by side, and a first connecting member and a second connecting member disposed at both ends of the first rotating shaft and the second rotating shaft, two ends of the first rotating shaft are rotatably connected to the first connecting member and the second connecting member, respectively, and two ends of the second rotating shaft are rotatably connected to the first connecting member and the second connecting member, respectively; a side of the stretching component near the second casing is fixedly connected to the first rotating shaft, and a side of the second casing near the stretching component is fixedly connected to both ends of the second rotating shaft.

In an embodiment of the present application, structures of the first rotating component and the second rotating component are same.

In an embodiment of the present application, the foldable display device further comprises a liquid crystal display (LCD) display screen disposed on a side of the second casing away from the flexible display component.

An embodiment of the present application further provides a foldable display device comprising: a first casing having a first receiving cavity inside, a rewinding component disposed in the first receiving cavity, a stretching component slidably connected to the first casing, a first rotating component connected to an end of the stretching component away from the first casing, a second casing connected to the first rotating component, and a flexible display component having a part disposed on a same side of the first casing and the second casing and another part protruding into the first receiving cavity and connected to the rewinding component; wherein the second casing is rotatably connected to the stretching component through the first rotating component; the flexible display component comprises a first display part, a second display part, and a third display part sequentially disposed adjacent to each other; the first display part is disposed on a side of the second casing, an end of the first display part away from the second display part is connected to the second casing, and an end of the third display part away from the second display part is connected to the rewinding component; when the foldable display device is in a first state, the stretching component and the first casing are deployed to each other, and the second casing and the stretching component are deployed to each other; the flexible display component is laid on a same side of the second casing, the stretching component, and the first casing, the first display part corresponds to the second casing, the second display part corresponds to the stretching component, and the third display part corresponds to the first casing; when the foldable display device is in a second state, the stretching component and the first casing are overlapped with each other, and the second casing and the stretching component are folded to each other; the first display part and the second display part are laid on a same side of the second casing and the first casing, the first display part corresponds to the second casing, the second display part corresponds to the first casing, and the third display part is rolled up in the first receiving cavity by the rewinding component.

Beneficial effect:

Beneficial effects of embodiments of the present application are that in embodiments of the present application, when the foldable display device is fully deployed, the first casing, the stretching component, and the second casing are deployed to each other, the flexible display component disposed in the first receiving cavity of the first casing is stretched out, so that the flexible display component is unfolded on the first casing, the stretching component, and the second casing, effectively increasing a display area, elastic pulling force provided by the rewinding component for the flexible display component at this time is beneficial to keep the flexible display component in a flat state and can improve a display performance. When the foldable display device is folded and stored, the stretching component is arranged to overlap the first casing, the second casing and the stretching component are folded, a part of the flexible display component is folded, another part of the flexible display component is curled in the first receiving cavity, the rewinding component and the stretching component can automatically adjust a curl length of the flexible display component, thereby adjusting a length of a folded part of the flexible display component. This prevents the flexible display component from being damaged during a folding process due to changes in an overall length of the stretching component, the first rotating component, and the second casing.

Therefore, on one hand, embodiments of the present application enable a foldable display device having a larger display area to exhibit a smaller volume when folded and stored, which is convenient to carry. On another hand, the rewinding component can either keep the flexible display component flat when the foldable display device is unfolded or adjust the curl length of the flexible display component when the foldable display device is folded to automatically compensate the length of the folded part of the flexible display component. This avoids damage to flexible display component when folded. In addition, an automatic compensation function of the rewinding component and the stretching component in the foldable display device can simplify a structural design of the first rotating component, and greatly reduce production cost and efficiency. In addition, the foldable display device of embodiments of the present application has a larger display area and a smaller storage volume, and can be used as an electronic map or the like. The larger display area can more clearly see a landform and layout, and the smaller storage volume is convenient to carry and is widely used.

DESCRIPTION OF DRAWINGS

In order to explain technical solutions in embodiments or the prior art more clearly, the accompanying drawings used in the description of the embodiments will be briefly introduced below. Obviously, the drawings in the following description are only some embodiments of the present invention. For those of ordinary skill in the art, other drawings can be obtained according to these drawings without paying creative efforts.

DETAILED DESCRIPTION OF PREFERRED EMBODIMENTS

The specific structural and functional details disclosed herein are merely representative and are used to describe exemplary embodiments of the present application. However, the present application may be embodied in many alternative forms and should not be construed as limited to the embodiments set forth herein.

In the description of the present application, it should be understood that the terms "center", "horizontal", "upper", "lower", "left", "right", "vertical", "horizontal", "top", "bottom", "inside", "outside", etc. are based on an orientation or positional relationship shown in the drawings. This is only for the convenience of describing the present application and simplifying the description. Rather than indicating or implying that a device or element referred to must have a particular orientation, be constructed and operate in a particular orientation. Therefore, it cannot be understood as a limitation on the present application. In addition, the terms "first" and "second" are only used for description purposes and cannot be understood as indicating or implying relative importance or implicitly indicating the number of technical features indicated. Therefore, the features defined as "first" and "second" may explicitly or implicitly include one or more of the features. In the description of the present application, unless otherwise stated, "multiple" means two or more. In addition, the term "including" and any variations thereof are intended to cover non-exclusive inclusion.

In the description of the present application, it should be noted that the terms "installation", "link", and "connection" should be interpreted in a broad sense unless otherwise specified and limited. For example, it may be a fixed connection, a detachable connection, or an integral connection. It can be a mechanical connection or an electrical connection. It can be directly connected or indirectly connected through an intermediate medium, and it can be an internal connection of two elements. For those of ordinary skill in the art, the specific meanings of the above terms in the present application can be understood in specific situations.

The terminology used herein is for the purpose of describing particular embodiments only and is not intended to limit the exemplary embodiments. Unless the context clearly indicates otherwise, as used herein, the singular forms "a" and "an" are intended to include the plural. It should also be understood that the terms "including" and/or "comprising" as used herein specify the existence of stated features, integers, steps, operations, units and/or components. This does not exclude the presence or addition of one or more other features, integers, steps, operations, units, components, and/or combinations thereof.

The present application is further described below with reference to the drawings and embodiments.

As shown in FIG. 1 to FIG. 8, an embodiment of the present application provides a foldable display device 1 including a first casing 2, a second casing 3, a rewinding component 4, a stretching component 5, a first rotating component 6 and a flexible display component 7. A first receiving cavity 8 is provided inside the first casing 2. The rewinding component 4 is disposed in the first receiving cavity 8. The rewinding component 4 has a function of automatically winding. The stretching component 5 is slidably connected to the first casing 2. The first rotating component 6 is connected to an end of the stretching component 5 away from the first casing 2. The first rotating component 6 is connected to an end of the second casing 3 near the stretching component 5. The second casing 3 is rotatably connected to the stretching component 5 through the first rotating component 6. A part of the flexible display component 7 is disposed on the same side of the first casing 2 and the second casing 3. Another part of the flexible display component 7 extends into the first receiving cavity 8 and is connected to the rewinding component 4. The flexible display component 7 can be partially curled on the rolling module 4 by the rolling function of the rewinding component 4, so as to be stored in the first receiving cavity 8. The flexible display component 7 can also be stretched out from the rewinding component 4 in the first receiving cavity 8 for display under action of a pulling force. When the flexible display component 7 disposed in the first receiving cavity 8 is stretched out, the rewinding component 4 provides the flexible display component 7 with a gathered elastic pulling force.

Figure 1:
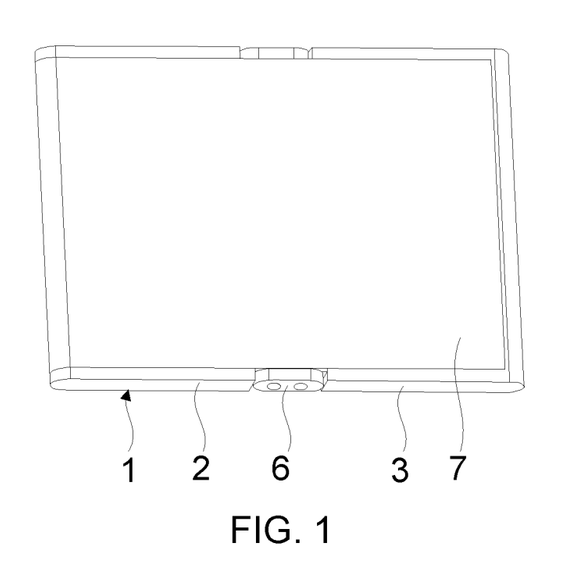
FIG. 1 is a schematic structural diagram of a foldable display device having an unfolded stretching component according to an embodiment of the present application.
Figure 2:
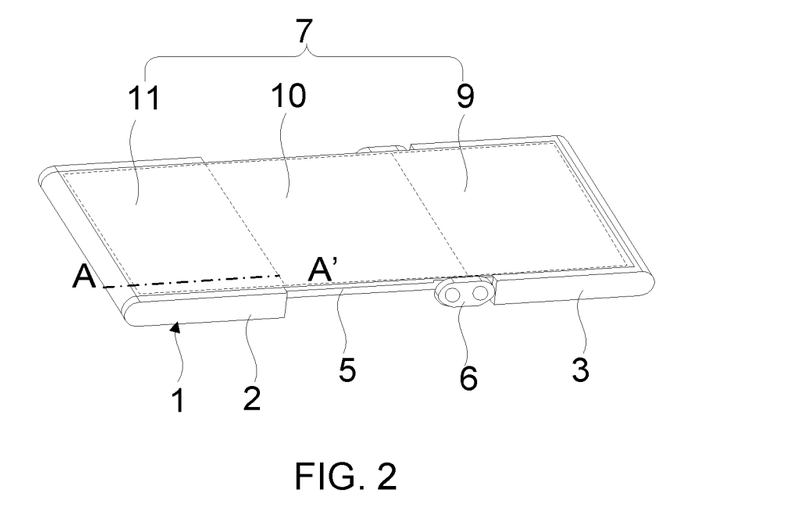
FIG. 2 is a schematic structural diagram of a fully expanded foldable display device according to an embodiment of the present application.
Figure 5:
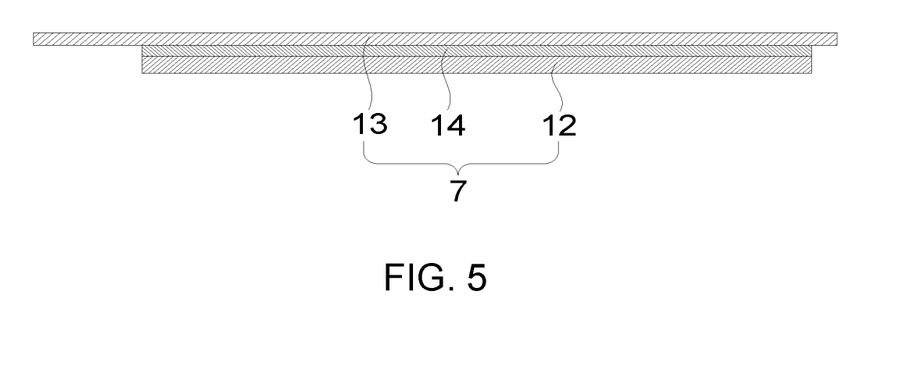
FIG. 5 is a schematic structural diagram of a flexible display component according to an embodiment of the present application.

Specifically, as shown in FIG. 2, the flexible display component 7 includes a first display part 9, a second display part 10, and a third display part 11 which are sequentially disposed adjacent to each other. The first display part 9 is provided on one side of the second casing 3. An end of the first display part 9 away from the second display part 10 is connected to the second casing 3. An end of the third display portion 11 away from the second display part 10 is connected to the rewinding component 4. It should be noted that the first display part 9, the second display part 10, and the third display part 11 of the flexible display component 7 are integrally formed in the same process. It is divided into the first display part 9, the second display part 10, and the third display part 11 only from the display area. In addition, as shown in FIG. 5, a composition structure of the flexible display assembly 7 includes a flexible screen 12, a protective cover 13 disposed on the flexible screen 12, and an adhesive layer 14 disposed between the protective cover 13 and the flexible screen 12. A length of the protective cover 13 is greater than a length of the flexible screen 12. The flexible screen 12 is used for display. The protective cover 13 is used to protect the flexible screen 12 from being damaged by scratches and is used to fix the two ends of the flexible display component 7 on another hand. For example, the first display part 9 is fixedly connected to an end of the second casing 3 away from the first casing 2 through the protective cover 13. The third display part 11 is fixedly connected to the rewinding component 4 through the protective cover 13. During the use and storage process of the foldable display device 1, parts of the protective cover 13 extending from the third display part 11 and not covering the flexible screen 12 are all disposed in the first receiving cavity 8. The protective cover 13 includes a flexible polyimide film (PI) or a flexible cover glass, which is not limited herein.

As shown in FIG. 2, when the foldable display device 1 is in a first state (fully expanded state), the stretching component 5 and the first casing 2 are mutually expanded (specifically, the stretching component 5 slides away from the first casing 2 until it is unfolded, or the first casing 2 slides away from the stretching component 5 until it is unfolded), and the second casing 3 and the stretching component 5 are unfolded to each other (specifically, the second casing 3 and the stretching component 5 is rotated to unfold by the first rotating component 6). At this time, the first casing 2, the stretching component 5, and the second casing 3 are deployed in the same direction. The flexible display component 7 is laid on the same side of the second casing 3, the stretching component 5, and the first casing 2. Specifically, the first display part 9 corresponds to the second casing 3, the second display part 10 corresponds to the stretching component 5, and the third display part 11 corresponds to the first casing 2. At this time, the first display part 9, the second display part 10, and the third display part 11 are located on the same plane and can be used for large-screen display. The second casing 3, the stretching component 5 and the first casing 2 provide support for the first display part 9, the second display part 10, and the third display part 11, respectively, which is beneficial to improving a display performance and protecting the flexible display component 7. In addition, the rewinding component 4 provides an elastic pulling force for the flexible display component 7 to be retracted into the first receiving cavity 8, so that the first display part 9, the second display part 10, and the third display part 11 are in a flat state.

It is understood that, during the use of the foldable display device 1, the stretching component 5 may be fully stretched between the first casing 2 and the second casing 3 according to the use occasion and the display area or may be partially stretched out or not. When the stretching component 5 is not stretched out, only the first display part 9 and the second display part 10 are used for display. When the stretching component 5 is fully extended, the first display part 9, the second display part 10, and the third display part 11 are all used for display. It should be noted that during the unfolding process of the foldable display device 1, the stretching component 5 can be stretched to any position within a stretchable range to adjust to a required display area.

Figure 6:
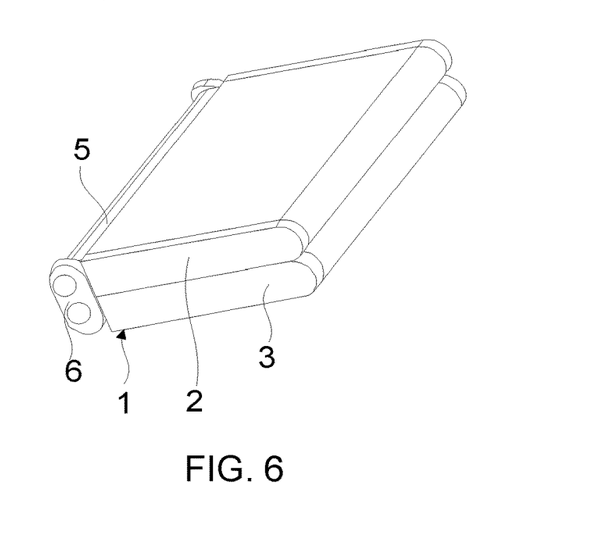
FIG. 6 is a schematic structural diagram of a fully expanded foldable display device according to an embodiment of the present application.

As shown in FIG. 6, when the foldable display device 1 is in a second state (completely folded state), the stretching component 5 and the first casing 2 are arranged to overlap each other (specifically, the stretching component 5 slides in a direction close to the first casing 2 to overlap, or the first casing 2 slides in a direction close to the stretching component 5 to overlap), and the second casing 3 and the stretching component 5 are arranged to be folded with each other (specifically, the second casing 3 and the stretching component 5 are rotated to be folded by the first rotating component 6). The first display part 9 and the second display part 10 are laid on the same side of the second casing 3 and the first casing 2, the first display part 9 and the second display part 10 are also folded to each other. The first display part 9 corresponds to the second casing 3, and the second display part 10 corresponds to the first casing 2 (or the stretching component 5), the third display part 11 is rolled up by the rewinding component 4 in the first receiving cavity 8. At this time, the first display part 9, the second display part 10, and the third display part 11 are all in a non-display state. It should be noted that the first display part 9 and the second display part 10 may be in an inner folded state or an outer folded state. In the inner folded state, the first display part 9 and the second display part 10 are folded between the stretching component 5 and the second casing 3. In the outer folded state, the first display part 9 and the second display part 10 are folded in the stretching component 5 and the outer side of the second casing 3.

During the process of folding the second casing 3 and the stretching component 5 to each other, the first display part 9 and the second display part 10 are also correspondingly folded to each other. The rewinding component 4 and the stretching component 5 can automatically adjust the curling length of the third display part 11, that is, adjust the length of the flexible display component 7 located outside the first receiving cavity 8. For example, when the first display part 9 and the second display part 10 are folded inside, the overall length of the side (inner side) of the stretching component 5, the first rotating component 6, and the second casing 3 that is close to the flexible display component 7 is smaller than a total length of the corresponding first display part 9 and second display part 10. The automatic winding function of the rewinding component 4 can increase the length of the third display part 11 curled on the rewinding component 4. This can reduce the length of the first display part 9 and the second display part 10 corresponding to the second casing 3, the stretching component 5, and the first rotating component 6. This can prevent the folded portions of the first display part 9 and the second display part 10 from being folded up because there is not enough space to place them. When the first display part 9 and the second display part 10 are folded outside, an overall length of the side (outside) of the stretching component 5, the first rotating component 6, and the second casing 3 near the flexible display component 7 is larger than the total length of the corresponding first display part 9 and the second display part 10. The stretching component 5 is slid in a direction away from the first casing 2 to drive the rewinding component 4 to rotate and stretch out the third display part 11 to reduce the length of the third display part 11 curled on the rewinding component 4. This increases the length of the flexible display component 7 corresponding to the second casing 3, the stretching component 5, and the first rotating component 6, and can prevent the first display part 9 and the second display part 10 from being broken due to excessive stretching.

If an area is displayed using an area of the flexible display component 7 corresponding to the first casing 2 as a unit display area, and if a length of the first casing 2 and lengths of the stretching component 5, the first sub casing 28, and the second sub casing 29 are same, display areas of the first display part 9, the second display part 10, and the third display part 11 are same, which are all equivalent to the unit display area. Then, when the stretching component 5 is stretched out and the stretching component 5 and the second casing 3 are unfolded, the foldable display device 1 has a double unit display area. When the first casing 2, the stretching component 5, and the second casing 3 are fully expanded, the foldable display device 1 has a unit display area of 3 times. It should be noted that the display area can also be expanded to 4 times the unit display area after the stretching component 5 is completely stretched out. Specifically, it is determined by structures of the stretching component 5 and the first casing 2. There is no limitation on the specific magnification of the display area.

In embodiments of the present application, when the foldable display device 1 is fully deployed, the first casing 2, the stretching component 5, and the second casing 3 are deployed to each other, the flexible display component 7 (the third display part 11) disposed in the first receiving cavity 8 of the first casing 2 is stretched out, so that the flexible display component 7 is unfolded on the first casing 2, the stretching component 5, and the second casing 3, effectively increasing a display area, elastic pulling force provided by the rewinding component 4 for the flexible display component 7 at this time is beneficial to keep the flexible display component 7 in a flat state and can improve a display performance. When the foldable display device 1 is folded and stored, the stretching component 5 is arranged to overlap the first casing 2, the second casing 3 and the stretching component 5 are folded, a part of the flexible display component 7 (the first display part 9 and the second display part 10) is folded, another part of the flexible display component 7 (the third display part 11) is curled in the first receiving cavity 8, the rewinding component 4 and the stretching component 5 can automatically adjust a curl length of the flexible display component 7, thereby adjusting a length of a folded part of the flexible display component 7. This prevents the flexible display component 7 from being damaged during a folding process due to changes in an overall length of the stretching component 5, the first rotating component 6, and the second casing 3.

Therefore, on one hand, embodiments of the present application enable a foldable display device 1 having a larger display area to exhibit a smaller volume when folded and stored, which is convenient to carry. On another hand, the rewinding component 4 can either keep the flexible display component 7 flat when the foldable display device 1 is unfolded or adjust the curl length of the flexible display component 7 when the foldable display device 1 is folded to automatically compensate the length of the folded part of the flexible display component 7. This avoids damage to flexible display component 7 when folded. In addition, an automatic compensation function of the rewinding component 4 and the stretching component 5 in the foldable display device 1 can simplify a structural design of the first rotating component 6, and greatly reduce production cost and efficiency. In addition, the foldable display device 1 of embodiments of the present application has a larger display area and a smaller storage volume, and can be used as an electronic map or the like. The larger display area can more clearly see a landform and layout, and the smaller storage volume is convenient to carry and is widely used.

Figure 3:
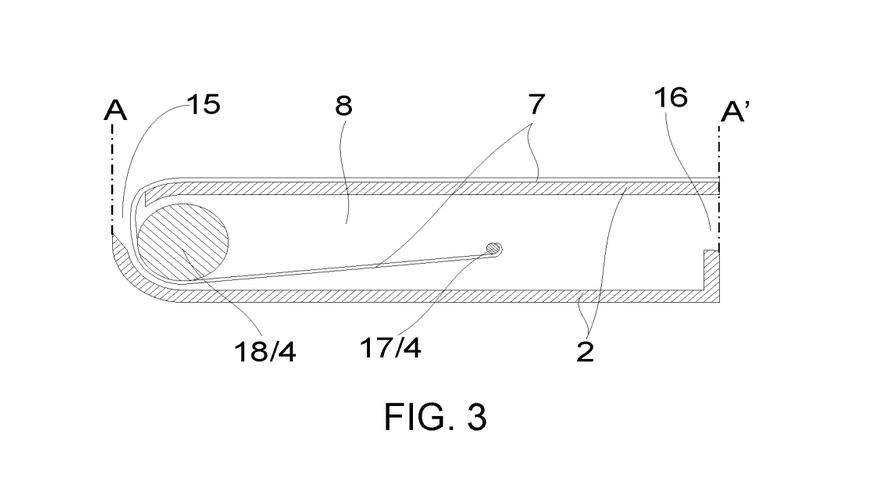
FIG. 3 is a schematic cross-sectional structure diagram of A-A' in FIG. 2.

In an embodiment, as shown in FIG. 3, a side of the first casing 2 away from the second casing 3 is provided with a first opening 15 in communication with the first receiving cavity 8. An end of the third display part 11 away from the second display part 10 is connected to the rewinding component 4 through the first opening 15. The first casing 2 is also provided with a second opening 16 on a side away from the first opening 15. The second opening 16 is in communication with the first receiving cavity 8. The stretching component 5 is received in the first receiving cavity 8 through the second opening 16 so as to be overlapped with the first casing 2.

Specifically, the first opening 15 may be located on an upper surface of the first casing 2 and an end remote from the second casing 3, or may be located on a side of the first casing 2, and the specific position is not limited herein.

Specifically, the stretching component 5 may include a stretching body and sliders (not shown in the figure) provided on both sides of the stretching body. A slide rail is provided inside a side wall of the first casing 2 corresponding to the sliders. The sliders can slide on the slide rail, so that the stretching component 5 and the first casing 2 are slidably connected (or slide rails are provided on both sides of the stretching body, and a slider is provided inside the side wall of the first casing 2 corresponding to the slide rail. The sliders can slide on the slide rail so that the stretching component 5 and the first casing 2 are slidably connected). A limiting structure is provided on the side of the stretching body away from the second casing 3 and on the side of the first casing 2 near the second casing 3 for fixing the stretching component 5 when the foldable display device 1 is fully deployed on the side of the first casing 2 near the second casing 3. The stretching component 5 may also be a comb-tooth structure. Correspondingly, a supporting structure of the first casing 2 near the flexible display assembly 7 is also a comb-tooth structure. The first casing 2 and the stretching component 5 are slidingly connected by a comb-tooth structure. Of course, the stretching component 5 can also be other structures that can be slidably connected with the first casing 2. The structures of the stretching component 5 and the first casing 2 suitable for the concept of the present application are all within the protection scope of the present application.

Figure 4:
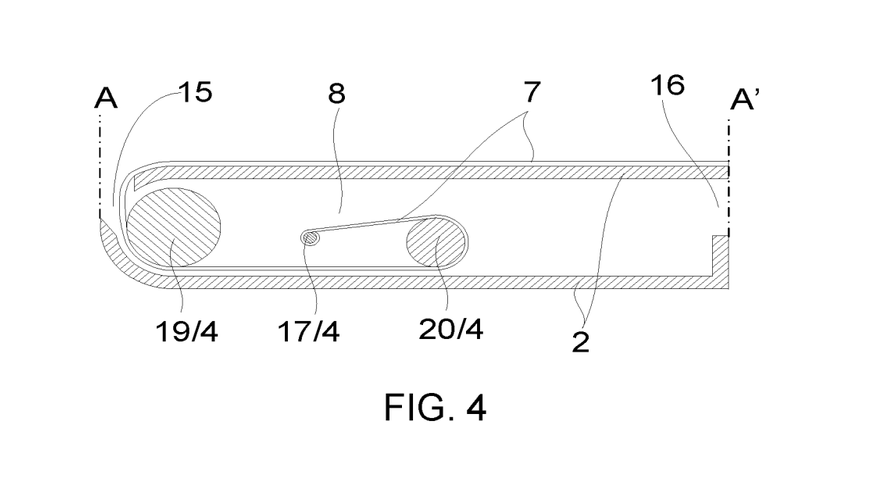
FIG. 4 is another schematic cross-sectional structure diagram of A-A' in FIG. 2.

Specifically, as shown in FIG. 3 and FIG. 4, the rewinding component 4 includes a coil spring 17. The coil spring 17 is located in the first receiving cavity 8 and is connected to the first casing 2. One end of the flexible display component 7 protruding into the first receiving cavity 8 is connected to the coil spring 17. The rewinding component 4 may further include a roller 18 having an axis parallel to the coil spring 17. The number of the roller 18 may be one or plural. When the number of the roller 18 is one, the roller 18 is located between the first opening 15 and the coil spring 17. An end of the third display part 11 away from the second display part 10 is connected to the coil spring 17 around the roller 18 via the first opening 15. When the number of the rollers 18 is plural, the radius of each roller 18 is different. For example, as shown in FIG. 4, the rewinding component 4 further includes a first roller 19 having a larger radius and a second roller 20 having a smaller radius. The axes of the first roller 19 and the second roller 20 are both parallel to the coil spring 17. The coil spring 17 is located between the first roller 19 and the second roller 20. The first roller 19, the coil spring 17, and the second roller 20 are disposed at intervals. The first roller 19 is located between the first opening 15 and the coil spring 17. An end of the third display part 11 away from the second display part 10 is sequentially connected to the coil spring 17 around the first roller 19 and the second roller 20 via the first opening 15. The gap formed by the rewinding component 4 can also be used to place a system circuit board and a battery of a display device. This makes full use of free space, which is conducive to reducing a size of the first casing 2 and the second casing 3 and facilitating storage.

In this embodiment, when the foldable display device 1 is unfolded, the stretching component 5 slides in a direction away from the first casing 2 through the second opening 16 to drive the rewinding component 4 to rotate in the first direction (for example, clockwise), And the third display part 11 is stretched out from the first opening 15. When the foldable display device 1 is folded, the stretching component 5 slides in a direction close to the first casing 2 through the second opening 16, and finally slides into the first receiving cavity 8. In this process, by the automatic rewinding action of the rewinding component 4, the rewinding component 4 rotates in the second direction (for example, counterclockwise) to wind up the third display part 11 in the first receiving cavity 8.

Figure 7:
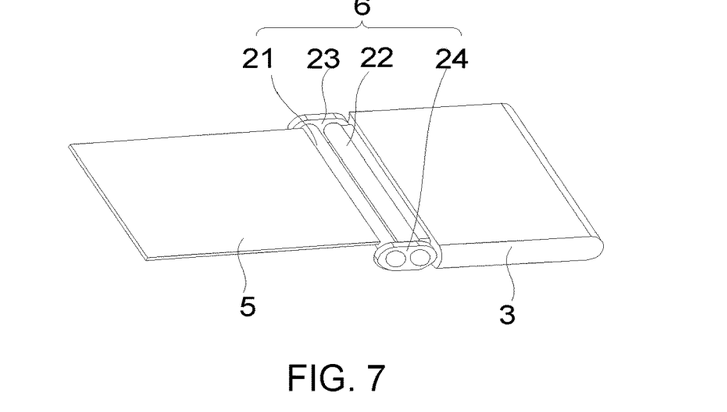
FIG. 7 is a schematic diagram of a connection structure between a stretching component and a second casing according to an embodiment of the present application.
Figure 8:
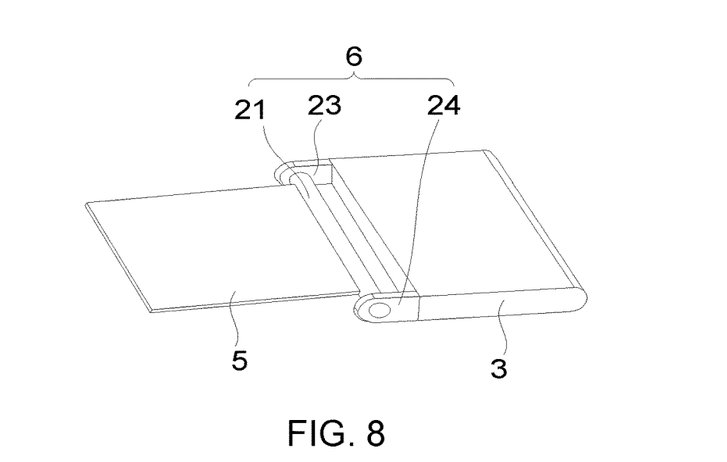
FIG. 8 is a schematic diagram of a connection structure between another stretching component and a second casing according to an embodiment of the present application.

In an embodiment, as shown in FIG. 7, the first rotating component 6 includes a first rotating shaft 21 and a second rotating shaft 22 disposed side by side and a first connecting member 23 and a second connecting member 24 located at both ends of the first rotating shaft 21 and the second rotating shaft 22. Both ends of the first rotating shaft 21 are rotatably connected to the first connecting member 23 and the second connecting member 24, respectively. The two ends of the second rotating shaft 22 are respectively rotationally connected with the first connecting member 23 and the second connecting member 24. A side of the stretching component 5 near the second casing 3 is fixedly connected to the first rotating shaft 21. A side of the second casing 3 near the stretching component 5 is fixedly connected to both ends of the second rotating shaft 22. Alternatively, as shown in FIG. 8, the first rotating component 6 includes a first rotating shaft 21 and first and second connecting members 23 and 24 located at both ends of the first rotating shaft 21. Both ends of the first rotating shaft 21 are rotatably connected to the first connecting member 23 and the second connecting member 24, respectively. A side of the stretching component 5 near the second casing 3 is fixedly connected to the first rotating shaft 21. A side of the second casing 3 near the stretching component 5 is fixedly connected to the first connecting member 23 and the second connecting member 24.

In this embodiment, compared to the technical solution of compensating the overall length of the surface of the stretching component 5 and the second casing 3 during the folding process by using the complicated structural design of the first rotating component 6 or the complicated design of the casing structure, the automatic compensation function of the rewinding component 4 and the stretching component 5 in the foldable display device 1 can make the structural design of the first rotating component 6 simpler, greatly reducing production cost and improving production efficiency.

Figure 9:
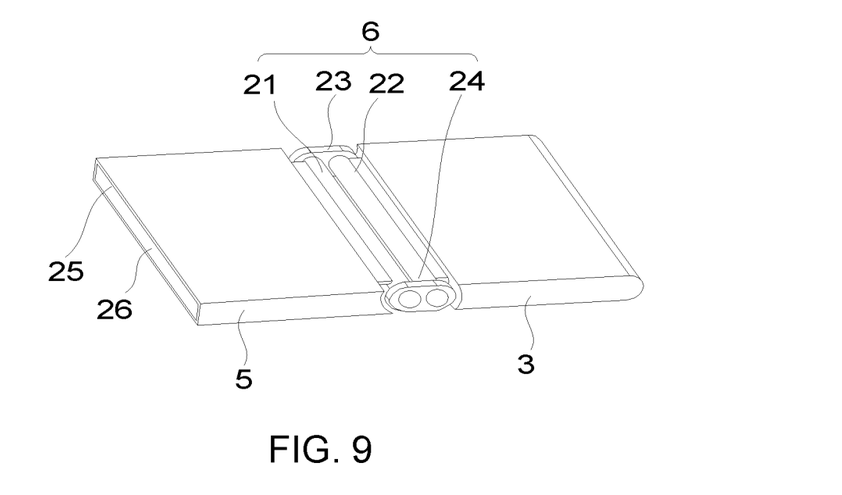
FIG. 9 is a schematic diagram of a connection structure between another stretching component and a second casing according to an embodiment of the present application.

As shown in FIG. 9, an embodiment of the present application further provides a foldable display device 1, which is different from the above embodiment in that: a third opening 25 is provided on a side of the stretching component 5 away from the second casing 3, the stretching component 5 is further provided with a second receiving cavity 26 in communication with the third opening 25, and the first casing 2 is received in the second receiving cavity 26 through the third opening 25 so as to be overlapped with the stretching component 5.

Specifically, the first casing 2 and the stretching component 5 are in a "drawer-type" sliding connection. The stretching component 5 can also be other structures that can be slidably connected to the first casing 2. The structures of the stretching component 5 and the first casing 2 suitable for the concept of the present application are all within the protection scope of the present application.

In this embodiment, when the foldable display device 1 is unfolded, the first casing 2 slides in a direction away from the stretching component 5 through the third opening 25 to drive the rewinding component 4 to rotate in the first direction (for example, clockwise), and the third display part 11 is stretched out from the first opening 15. When the foldable display device 1 is folded, the first casing 2 slides in a direction close to the stretching component 5 through the third opening 25, and finally slides into the second receiving cavity 26. In this process, by the automatic rewinding action of the rewinding component 4, the rewinding component 4 rotates in the second direction (for example, counterclockwise) to wind up the third display part 11 in the first receiving cavity 8.

Figure 10:
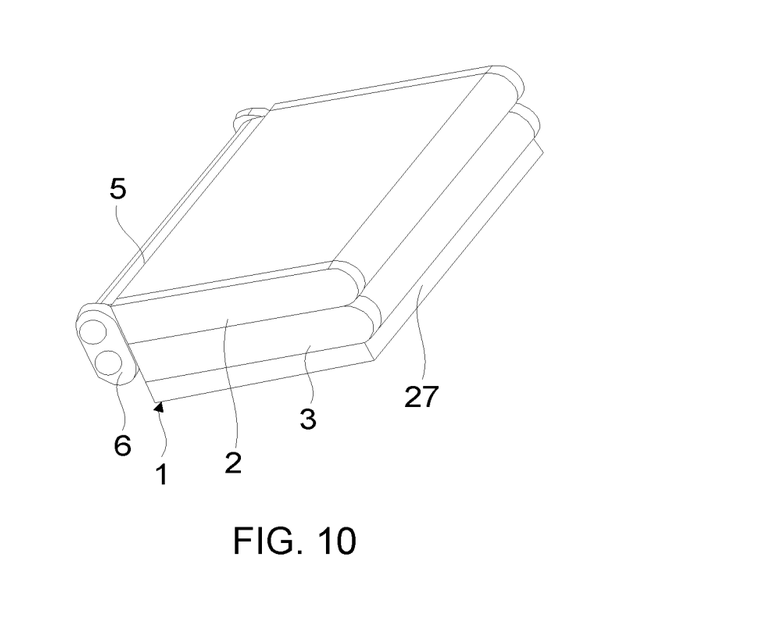
FIG. 10 is a schematic structural diagram of another fully expanded foldable display device according to an embodiment of the present application.
Figure 11:
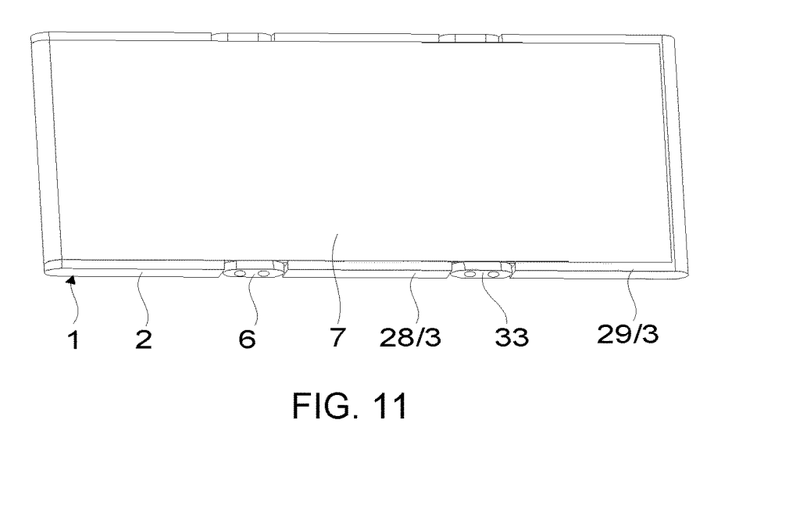
FIG. 11 is a schematic structural diagram of another unexpanded foldable display device according to an embodiment of the application.

As shown in FIG. 10, an embodiment of the present application further provides a foldable display device 1, which is different from the above embodiment in that: a liquid crystal display (LCD) display screen 27. Specifically, the first display part 9 and the second display part 10 are in a folded state when folded. That is, the first display part 9 and the second display part 10 are folded with each other and are located between the second casing 3 and the stretching component 5 which are folded with each other. The LCD display screen 27 may be packaged in a rigid glass. The LCD display screen 27 may also be disposed on a side of the first casing 2 away from the flexible display component 7, which is not limited herein.

In this embodiment, since the flexible display component 7 is a flexible structure, the first display part 9 and the second display part 10 of the foldable display device 1 are folded inside, and the first display part 9 of the flexible display component 7 can be folded during storage. The second display part 10 is protected between the second casing 3 and the stretching component 5 (the third display part 11 is located in the first receiving cavity 8 and is protected by the first casing 2). This prevents the flexible display component 7 from being scratched or damaged by external impact. In addition, a rigid LCD display screen 27 is provided on a side of the second casing 3 away from the flexible display component 7. When the foldable display device 1 is folded, it still has a controllable interface. This makes the foldable display device 1 in embodiments the present application applicable to harsh environments and expands the application range of the product.

As shown in FIG. 11 to FIG. 14, embodiments of the present application further provide a foldable display device 1. The difference from the above embodiment is that the second casing 3 includes a plurality of sub casings arranged in sequence, and any adjacent two sub casings are rotatably connected by the second rotating component 30. The number of sub casings is not shown here. For example, the second casing 3 includes a first sub casing 28, a second sub casing 29, and a second rotating component 30 located between the first sub casing 28 and the second sub casing 29. The first sub casing 28 is rotatably connected to the second sub casing 29 through a second rotating component 30. The first sub casing 28 is also connected to the first rotating component 6. The first sub casing 28 is also rotatably connected to the stretching component 5 through the first rotating component 6.

Figure 12:
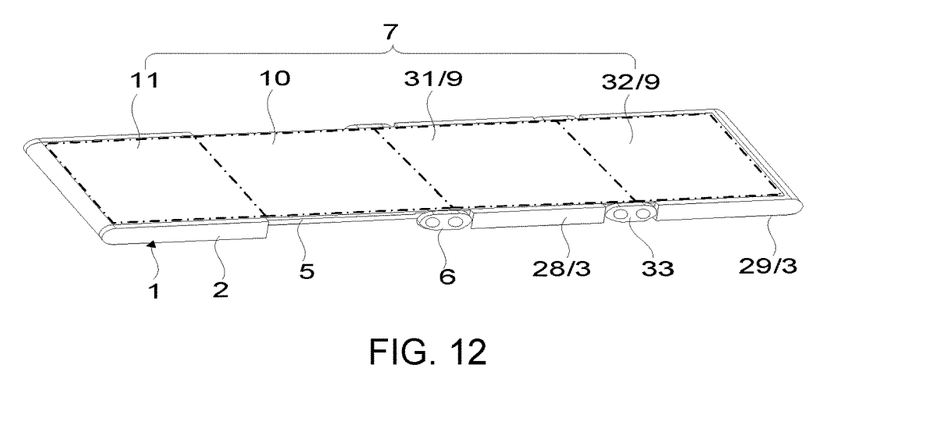
FIG. 12 is a schematic structural diagram of another fully expanded foldable display device according to an embodiment of the present application.

Specifically, as shown in FIG. 12, the first display part 9 includes a first sub-display part 31 and a second sub-display part 32 which are disposed adjacently. The first sub-display part 31 is located between the second display part 10 and the second sub-display part 32. The first sub-display part 31 is provided corresponding to the first sub casing 28, and the second sub-display part 32 is provided corresponding to the second sub casing 29.

As shown in FIG. 12, when the foldable display device 1 is in the first state (fully expanded state), the stretching component 5 and the first casing 2 are mutually expanded, and the first sub casing 28, the second sub casing 29, and the stretching component 5 are all deployed. The flexible display component 7 is laid on the same side of the first sub casing 28, the second sub casing 29, the stretching component 5, and the first casing 2. The first sub-display part 31 corresponds to the first sub casing 28, the second sub-display part 32 corresponds to the second sub casing 29, the second display part 10 corresponds to the stretching component 5, and the third display part 11 corresponds to the first casing 2.

Figure 13:
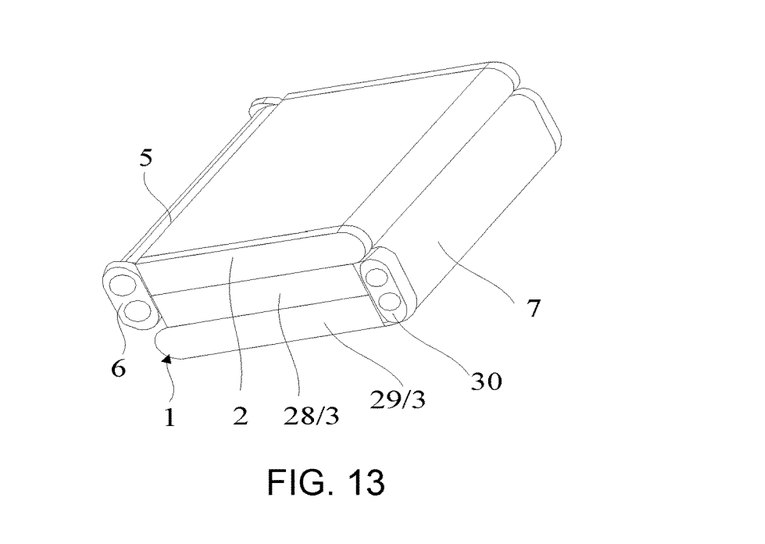
FIG. 13 is a schematic structural diagram of another fully expanded foldable display device according to an embodiment of the present application.

As shown in FIG. 13, when the foldable display device 1 is in the second state (completely folded state), the stretching component 5 and the first casing 2 are disposed to overlap each other. The first sub casing 28 and the stretching component 5 are arranged to be folded with each other. The second sub casing 29 and the first sub casing 28 are folded to each other. The first sub display part 31, the second sub display part 32, and the second display part 10 are laid on the same side of the second sub casing 29, the first sub casing 28, and the first casing 2. The first sub display part 31 corresponds to the first sub casing 28. The second sub display part 32 corresponds to the second sub casing 29. The second display part 10 corresponds to the first casing 2 (or the stretching component 5). The third display part 11 is rolled up by the rewinding component 4 in the first receiving cavity 8.

Specifically, the second rotating component 30 includes an inner folding rotating component and an outer folding rotating component, and further includes a rotating component that can be folded inwardly or outwardly. The structures of the second rotating component 30 and the first rotating component 6 may be the same or different, which is not limited herein.

Specifically, when the foldable display device 1 is in the second state, the stretching component 5, the first sub casing 28 and the second sub casing 29 may be arranged in a zigzag stack. Of course, it can also be other forms of folding settings, which are not limited here.

Figure 14:
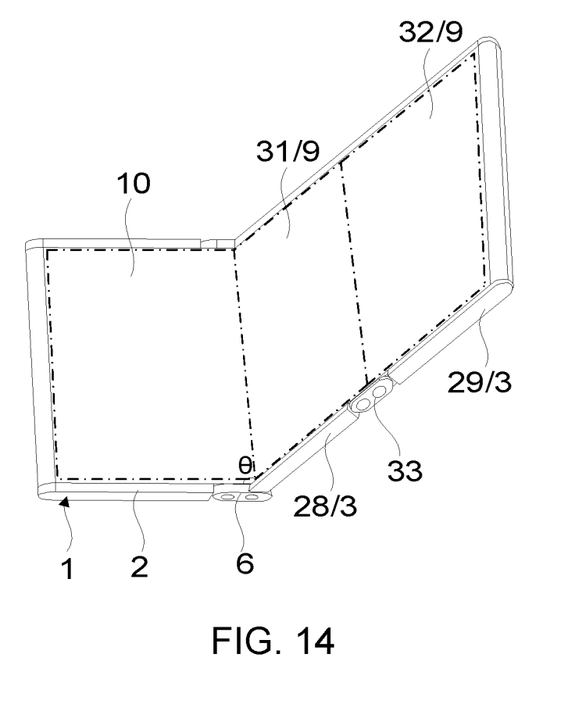
FIG. 14 is a schematic structural diagram of another unexpanded foldable display device according an embodiment of the present application.

As shown in FIG. 14, when the foldable display device 1 is in a third state (semi-expanded state), the stretching component 5 and the first casing 2 are disposed to overlap each other. The second casing 3 and the stretching component 5 are rotated to be set at a preset included angle θ. The first sub casing 28 and the second sub casing 29 are mutually expanded. The flexible display component 7 is laid on the same side of the first casing 2, the first sub casing 28, and the second sub casing 29. The first sub display part 31 corresponds to the first sub casing 28. The second-sub display part 32 corresponds to the second sub casing 29. The second display part 10 corresponds to the first casing 2 (or the stretching component 5). The third display part 11 is rolled up by the rewinding component 4 in the first receiving cavity 8.

Specifically, the preset included angle θ ranges from 60 degrees to 120 degrees. For example, when the preset included angle θ is 90 degrees, the second casing 3 (including the first sub casing 28 and the second sub casing 29) is disposed perpendicularly to the first casing 2 (or the stretching component 5). The foldable display device 1 can use the first casing 2 as a base. At this time, the third display part 11 is located on the first casing 2 and can be used as an operation interface, such as a virtual keyboard. The first sub display part is located on the first sub casing 28. The second sub-display part is located on the second sub casing 29. The first-sub display part 31 and the second-sub display part 32 can be used as a display interface, which is convenient for users to use in multiple styles.

In this embodiment, if an area of the flexible display component 7 corresponding to the first housing 2 is used as a unit display area, and if the length of the first casing 2 is respectively equal to that of the stretching component 5, display areas of the first sub-display part 31, the second sub-display part 32, the second display part 10, and the third display part 11 are same, and are equivalent to the unit display area. Then, when the foldable display device 1 is fully unfolded, it has 4 times the unit display area, and only has a storage area corresponding to the unit display area during storage, and the overall volume is small and easy to carry. In addition, when the foldable display component is folded, the flexible display component 7 is folded twice. When it is used next time, it is prone to wrinkle or lift off the casing, which is not conducive to improving display performance. The rewinding component 4 of the embodiment of the present application has function of automatic rewinding, and can provide the flexible display component 7 with a pulling force to be retracted into the first receiving cavity 8 when the flexible display component 7 is deployed, which is helpful to ensure that the flexible display component 7 remains flat, thereby improving display performance. In addition, during the folding process of the flexible display component 7, the stretching component 5 and the rewinding component 4 can also automatically compensate the length of the flexible display component 7 of the folded portion. This is beneficial for protecting the flexible display component 7, simplifying the structure of the first rotating component 6, and preventing the first rotating component 6 from protecting the flexible display component 7 of the folded portion through a complicated structure. It is important that when the second casing 3 includes two or more sub casings, the foldable display component has at least 4 times the unit display area. This can be used as an electronic map or the like. The larger display area can more clearly see a landform and layout, and the small storage volume is small and convenient for storage, which is widely used.

In summary, although the present application has been disclosed above with preferred embodiments, the above preferred embodiments are not intended to limit the present application. Those of ordinary skill in the art can make various modifications and improvements without departing from the spirit and scope of the present application. Therefore, the protection scope of this application is subject to the scope defined by the claims.

What is claimed is:

1. A foldable display device, comprising:
a first casing having a first receiving cavity inside, a rewinding component disposed in the first receiving cavity, a stretching component slidably connected to the first casing, a first rotating component connected to an end of the stretching component away from the first casing, a second casing connected to the first rotating component, and a flexible display component having a part disposed on a same side of the first casing and the second casing and another part protruding into the first receiving cavity and connected to the rewinding component; wherein the second casing is rotatably connected to the stretching component through the first rotating component; and
wherein when the flexible display component disposed in the first receiving cavity is stretched out, the rewinding component provides a flexible elastic pulling force to the flexible display component;
wherein the flexible display component comprises a first display part, a second display part, and a third display part sequentially disposed adjacent to each other;
wherein the first display part is disposed on a side of the second casing, an end of the first display part away from the second display part is connected to the second casing, and an end of the third display part away from the second display part is connected to the rewinding component;
wherein the second casing comprises a first sub casing, a second sub casing, and a second rotating component disposed between the first sub casing and the second sub casing; the first sub casing is rotatably connected to the second sub casing through the second rotating component the first sub casing is further connected to the first rotating component, and the first sub casing is further rotatably connected to the stretching component through the first rotating component.

2. The foldable display device according to claim 1, wherein when the foldable display device is in a first state, the stretching component and the first casing are deployed to each other, and the second casing and the stretching component are deployed to each other;
wherein the flexible display component is laid on a same side of the second casing, the stretching component, and the first casing, the first display part corresponds to the second casing, the second display part corresponds to the stretching component, and the third display part corresponds to the first casing.

3. The foldable display device according to claim 1, wherein when the foldable display device is in a second state, the stretching component and the first casing are overlapped with each other, and the second casing and the stretching component are folded to each other;
wherein the first display part and the second display part are laid on a same side of the second casing and the first casing, the first display part corresponds to the second casing, the second display part corresponds to the first casing, and the third display part is rolled up in the first receiving cavity by the rewinding component.

4. The foldable display device according to claim 1, wherein the first display part comprises a first sub-display part and a second sub-display part arranged adjacently, the first sub-display part is disposed between the second display part and the second sub-display part, the first sub-display part is disposed corresponding to the first sub casing, and the second sub-display part is disposed corresponding to the second sub casing.

5. The foldable display device according to claim 4, wherein when the foldable display device is in a first state, the stretching component and the first casing are deployed to each other, and the first sub casing, the second sub casing, and the stretching component are all deployed;
wherein the flexible display component is laid on a same side of the first sub casing, the second sub casing, the stretching component, and the first casing, the first sub display part corresponds to the first sub casing, the second sub-display part corresponds to the second sub casing, the second display part corresponds to the stretching component, and the third display part corresponds to the first casing.

6. The foldable display device according to claim 4, wherein when the foldable display device is in a second state, the stretching component and the first casing are overlapped with each other, the first sub casing and the stretching component are folded to each other, and the second sub casing and the first sub casing are folded to each other;
wherein the first sub-display part, the second sub-display part, and the second display part are laid on a same side of the second sub casing, the first sub casing, and the first casing, the first sub-display part corresponds to the first sub casing, the second sub-display part corresponds to the second sub casing, the second display part corresponds to the first casing, and the third display part is rolled up in the first receiving cavity by the rewinding component.

7. The foldable display device according to claim 6, wherein when the foldable display device is in the second state, the stretching component, the first sub casing and the second sub casing are arranged in a zigzag shape.

8. The foldable display device according to claim 4, wherein when the foldable display device is in a third state, the stretching component and the first casing are overlapped with each other, the second casing and the stretching component are rotated to be set at a preset included angle, and the first sub casing and the second sub casing are deployed to each other;

wherein the flexible display component is laid on a same side of the first casing, the first sub casing, and the second sub casing, the first sub-display part corresponds to the first sub casing, the second sub-display part corresponds to the second sub casing, the second display part corresponds to the first casing, and the third display part is rolled up in the first receiving cavity by the rewinding component.

9. The foldable display device according to claim 8, wherein the preset included angle ranges from 60 degrees to 120 degrees.

10. The foldable display device according to claim 1, wherein a side of the first casing away from the second casing is provided with a first opening communicating with the first receiving cavity; an end of the third display part away from the second display part is connected to the rewinding component through the first opening.

11. The foldable display device according to claim 10, wherein a side of the first casing away from the first opening is provided with a second opening, and the second opening is in communication with the first receiving cavity, the stretching component is received in the first receiving cavity through the second opening so as to be overlapped with the first casing.

12. The foldable display device according to claim 10, wherein a side of the stretching component away from the second casing is provided with a third opening, the stretching component is further provided with a second receiving cavity which is in communication with the third opening, and the first casing is received in the second receiving cavity through the third opening so as to be overlapped with the stretching component.

13. The foldable display device according to claim 1, wherein the rewinding component comprises a coil spring, the coil spring is disposed in the first receiving cavity and is connected to the first casing, and an end of the flexible display component protruding into the first receiving cavity is connected to the coil spring.

14. The foldable display device according to claim 13, wherein the rewinding component further comprises a roller disposed in the first receiving cavity and having an axis parallel to the coil spring; the roller is disposed on a side of the coil spring away from the second casing, and an end of the flexible display component away from the second casing is connected to the coil spring in the first receiving cavity around the roller.

15. The foldable display device according to claim 1, wherein the first rotating component comprises a first rotating shaft and a second rotating shaft arranged side by side, and a first connecting member and a second connecting member disposed at both ends of the first rotating shaft and the second rotating shaft, two ends of the first rotating shaft are rotatably connected to the first connecting member and the second connecting member, respectively, and two ends of the second rotating shaft are rotatably connected to the first connecting member and the second connecting member, respectively;

wherein a side of the stretching component near the second casing is fixedly connected to the first rotating shaft, and a side of the second casing near the stretching component is fixedly connected to both ends of the second rotating shaft.

16. The foldable display device according to claim 1, wherein structures of the first rotating component and the second rotating component are same.

17. The foldable display device according to claim 1, further comprising a liquid crystal display (LCD) screen disposed on a side of the second casing away from the flexible display component.

* * * * *